(12) United States Patent
Tan et al.

(10) Patent No.: US 12,399,293 B1
(45) Date of Patent: Aug. 26, 2025

(54) METHOD AND SYSTEM FOR PREDICTING OCCURRENCE DEPTH OF WEATHERING CRUST-TYPE RARE EARTH DEPOSIT OREBODY

(71) Applicant: Guangzhou Institute of Geochemistry, Chinese Academy of Sciences, Guangzhou (CN)

(72) Inventors: Wei Tan, Guangzhou (CN); Lianying Luo, Guangzhou (CN); Mengqi Han, Guangzhou (CN); Hongping He, Guangzhou (CN); Jianxi Zhu, Guangzhou (CN); Xiaoliang Liang, Guangzhou (CN); Gaofeng Wang, Guangzhou (CN); Xiaorong Qin, Guangzhou (CN); Yilin He, Guangzhou (CN)

(73) Assignee: Guangzhou Institute of Geochemistry, Chinese Academy of Sciences, Guangzhou (CN)

( * ) Notice: Subject to any disclaimer, the term of this patent is extended or adjusted under 35 U.S.C. 154(b) by 0 days.

(21) Appl. No.: 18/945,616

(22) Filed: Nov. 13, 2024

(30) Foreign Application Priority Data

Jul. 24, 2024 (CN) .......................... 202411001046.5

(51) Int. Cl.
*G01V 3/02* (2006.01)
*G06F 30/23* (2020.01)

(52) U.S. Cl.
CPC ................ *G01V 3/02* (2013.01); *G06F 30/23* (2020.01)

(58) Field of Classification Search
CPC .................................. G01V 3/02; G06F 30/23
See application file for complete search history.

(56) References Cited

U.S. PATENT DOCUMENTS

| | | | | |
|---|---|---|---|---|
| 1,813,845 A | * | 7/1931 | Gish | G01V 3/04 244/53 R |
| 2,305,384 A | * | 12/1942 | Hoover, Jr. | G01V 11/00 436/28 |
| 3,186,502 A | * | 6/1965 | Rademacher | G01V 1/16 175/67 |
| 2015/0061683 A1 | * | 3/2015 | Marsala | G01V 3/08 324/355 |
| 2017/0096894 A1 | * | 4/2017 | Von Schönebeck | E01C 23/088 |

FOREIGN PATENT DOCUMENTS

CN 108241180 * 7/2018 ............. G01N 33/24

* cited by examiner

*Primary Examiner* — Lisa M Caputo
*Assistant Examiner* — Sharah Zaab
(74) *Attorney, Agent, or Firm* — Bayramoglu Law Offices LLC

(57) ABSTRACT

A method and a system for predicting an occurrence depth of a weathering crust-type rare earth deposit orebody are provided. The method includes: performing field test on a weathering crust by using a high-density electrical method; performing computational inversion on test results to obtain apparent resistivity data of the weathering crust at different depths; and correcting a distortion value of the apparent resistivity data due to terrain fluctuations based on a terrain of the weathering crust, obtaining apparent resistivity data of the weathering crust after terrain correction at different depths by using a ratio method, further obtaining a first-order derivative curve of the apparent resistivity versus depth changes, and determining the occurrence depth of the rare earth orebody by combining parameters of a logistic regression model.

5 Claims, 4 Drawing Sheets

Performing field test on a weathering crust by using a high-density electrical method to obtain test results Performing computational inversion on the test results to obtain apparent resistivity data of the weathering crust at different depths Correcting a distortion value of the apparent resistivity data due to terrain fluctuations based on a terrain of the weathering crust, and obtaining terrain-corrected apparent resistivity data Obtaining a first-order derivative curve of the apparent resistivity versus depth changes based on the terrain-corrected apparent resistivity data, and determining the occurrence depth of the rare earth orebody by combining parameters of a logistic regression model

METHOD AND SYSTEM FOR PREDICTING OCCURRENCE DEPTH OF WEATHERING CRUST-TYPE RARE EARTH DEPOSIT OREBODY

CROSS REFERENCE TO THE RELATED APPLICATIONS

This application is based upon and claims priority to Chinese Patent Application No. 202411001046.5, filed on Jul. 24, 2024, the entire contents of which are incorporated herein by reference.

TECHNICAL FIELD

The present invention relates to the technical field of geological exploration, and in particular, to a method and a system for predicting an occurrence depth of a weathering crust-type rare earth deposit orebody.

BACKGROUND

Rare earth elements, as "industrial vitamins", are widely used in the fields of new energy technologies, new materials, aerospace, military industry and the like. With the increasing demand for rare earth year by year, the exploration, development and utilization of rare earth deposits have become particularly important.

The weathering crust-type rare earth deposit is mainly distributed in the weathering crust of granite, characterized by high content of medium and heavy rare earths, complete rare earth partitioning, low radioactivity and easy mining. The groundwater structure can affect the migration and enrichment of rare earth in the weathering crust-type rare earth deposit. The increase in water content in the weathering crust leads to a decrease in the permeability of the weathering crust, which is conducive to the adsorption of rare earth ions by clay minerals and the formation of orebodies. The burial depth of weathering crust-type rare earth orebody is generally 1-10 m, and the partial burial depth can reach 20 m. However, the existing geochemical exploration for delineating the orebody often leads to the neglect of some orebodies, and the inability to accurately confirm the ore-rich layer in the weathering crust-type rare earth orebody.

Therefore, how to accurately confirm the occurrence depth of the ore-rich layer in weathering crust-type rare earth orebody is an issue to be solved urgently by those skilled in the art.

SUMMARY

In view of this, the present invention provides a method and a system for predicting an occurrence depth of a weathering crust-type rare earth deposit orebody, which judge the position of the orebody of the weathered crust-type rare earth deposit by using the parameters of the logistic regression model, and further improve delineation accuracy of the occurrence depth of the ore-rich layer of the weathered crust-type rare earth deposit.

To achieve the above objective, the present invention provides the following technical solutions.

The present invention discloses a method for predicting an occurrence depth of a weathering crust-type rare earth deposit orebody includes the following steps:

performing field test on a weathering crust by using a high-density electrical method to obtain test results;

performing computational inversion on the test results to obtain apparent resistivity data of the weathering crust at different depths;

correcting a distortion value of the apparent resistivity data due to terrain fluctuations based on a terrain of the weathering crust, and obtaining terrain-corrected apparent resistivity data; and obtaining a first-order derivative curve of the apparent resistivity versus depth changes based on the terrain-corrected apparent resistivity data, and determining the occurrence depth of the rare earth orebody by combining parameters of a logistic regression model.

Further, the field test includes: performing resistance sampling along a longitudinal direction of a survey line profile by taking the crest of the weathering crust as a midpoint and using a Winner device with set electrode spacing and channel number to obtain an observed apparent resistivity value of a survey point.

Further, the test result is subjected to computational inversion by a Zohdy method, the apparent resistivity of the weathering crust-type rare earth deposit is obtained by iterative computation, and an iterative formula is as follows:

$$\frac{\rho_{i+1}(l, n)}{\rho_i(l, n)} = \frac{\rho_0(l, n)}{\rho_{ci} * l, n)};$$

wherein (l,n) represents small cells in an $l^{th}$ row and an $n^{th}$ column, $\rho_i$ and $\rho_{i+1}$ represent resistivity values obtained in an $i^{th}$ iteration and an $(i+1)^{th}$ iteration, respectively, $\rho_0$ represents the observed apparent resistivity value, and $\rho_{ci}$ represents the apparent resistivity value obtained by finite element calculation.

Further, the correcting a distortion value of the apparent resistivity data due to terrain fluctuations includes the following steps:

collecting elevations of survey points, and obtaining a terrain angular domain slope of the weathering crust based on the elevations of the survey points;

obtaining apparent resistivity distortion values of the survey points by using a product superposition formula;

$$\frac{\rho_s}{\rho} \approx \left(\frac{\rho_s}{\rho}\right)_1 \cdot \left(\frac{\rho_s}{\rho}\right)_2 \frac{1}{\cos\beta_2} \cdot \left(\frac{\rho_s}{\rho}\right)_3 \frac{1}{\cos\beta_3} \cdots \left(\frac{\rho_s}{\rho}\right)_m \frac{1}{\cos\beta_m};$$

wherein $\rho_s/\rho$ is an apparent resistivity distortion value at a point on the continuous finite terrain, $(\rho_s/\rho)_1 \ldots (\rho_s/\rho)_m$ are apparent resistivity distortion values of the corresponding points in each angular domain, and $\beta_1 \ldots \beta_m$ are slopes of the angular domains at the corresponding point; and comparing the apparent resistivity $\rho_{ci}$ with the apparent resistivity distortion value $\rho_s/\rho$ by using a ratio method to obtain the terrain-corrected apparent resistivity data $\rho_d$.

Further, the apparent resistivities of adjacent points in the longitudinal direction of the survey line profile in the terrain-corrected apparent resistivity data are averaged and then fitted to obtain an encrypted longitudinal apparent resistivity curve, wherein the encryption refers to fitting the apparent resistivity curve with the original data and the average data of the adjacent points; the longitudinal apparent resistivity curve is derived to obtain a first-order derivative curve of the apparent resistivity versus depth changes;

the formula of the logistic regression model is as follows:

$$y = 0.10984649 \times \text{Depth} - 0.00107128 \times \rho_d - 0.00172985 \times \text{FirstDerivative} + 0.00158755$$

$$P = \frac{1}{1 + e^{-y}}$$

wherein y represents intercept, P represents a logistic regression output coefficient, Depth represents a depth, FirstDerivative represents a first-order derivative; and judging the position of the orebody by using the parameters of the logistic regression model by combining the depth and the corrected apparent resistivity value, and judging the orebody when P is more than 0.5.

The present invention further discloses a system for predicting an occurrence depth of a weathering crust-type rare earth deposit orebody, which includes:
    a data acquisition module, configured to perform field test on a weathering crust by using a high-density electrical method to obtain test results;
    an inversion module, configured to perform computational inversion on the test results to obtain apparent resistivity data of the weathering crust at different depths;
    a distortion correction module, configured to correct a distortion value of the apparent resistivity data due to terrain fluctuations based on a terrain of the weathering crust, and obtain terrain-corrected apparent resistivity data by using a ratio method; and
    an occurrence depth confirmation module, configured to obtain a first-order derivative curve of the apparent resistivity versus depth changes based on the terrain-corrected apparent resistivity data, and determine the occurrence depth of the rare earth orebody by combining parameters of a logistic regression model.

It can be known from the above technical solutions that, compared with the prior techniques, the present invention provides a method and a system for predicting an occurrence depth of a weathering crust-type rare earth deposit orebody, wherein the occurrence depth of the orebody of the weathered crust-type rare earth deposit is judged by using the weathering crust depth, the terrain-corrected apparent resistivity and the first-order derivative of the terrain-corrected apparent resistivity and combining the P value, and the accuracy of the orebody depth can reach 0.83; the in-situ nondestructive testing can be performed by using the geophysical means to rapidly delineate the orebody at a low cost, which meets the requirement of rapidly and accurately delineating the orebody during geological exploration work of the weathered crust-type rare earth deposit; and the survey lines can be set up on a large scale to avoid missing delineation of rare earth orebodies and accurately obtain regional orebody depth information, thereby accurately evaluating rare earth minerals and efficiently and rationally utilizing rare earth resources.

BRIEF DESCRIPTION OF THE DRAWINGS

To more clearly illustrate the technical solutions in the embodiments of the present invention or in the prior art, the drawings required to be used in the description of the embodiments or the prior art are briefly introduced below. It is obvious that the drawings in the description below are merely embodiments of the present invention, and those of ordinary skill in the art can obtain other drawings according to the drawings provided without creative efforts.

DETAILED DESCRIPTION OF THE EMBODIMENTS

The following clearly and completely describes the technical solutions in the embodiments of the present invention with reference to drawings in the embodiments of the present invention. It is clear that the described embodiments are merely a part rather than all of the embodiments of the present invention. Based on the embodiments of the present invention, all other embodiments obtained by those of ordinary skill in the art without creative efforts shall fall within the protection scope of the present invention.

Figure 1:
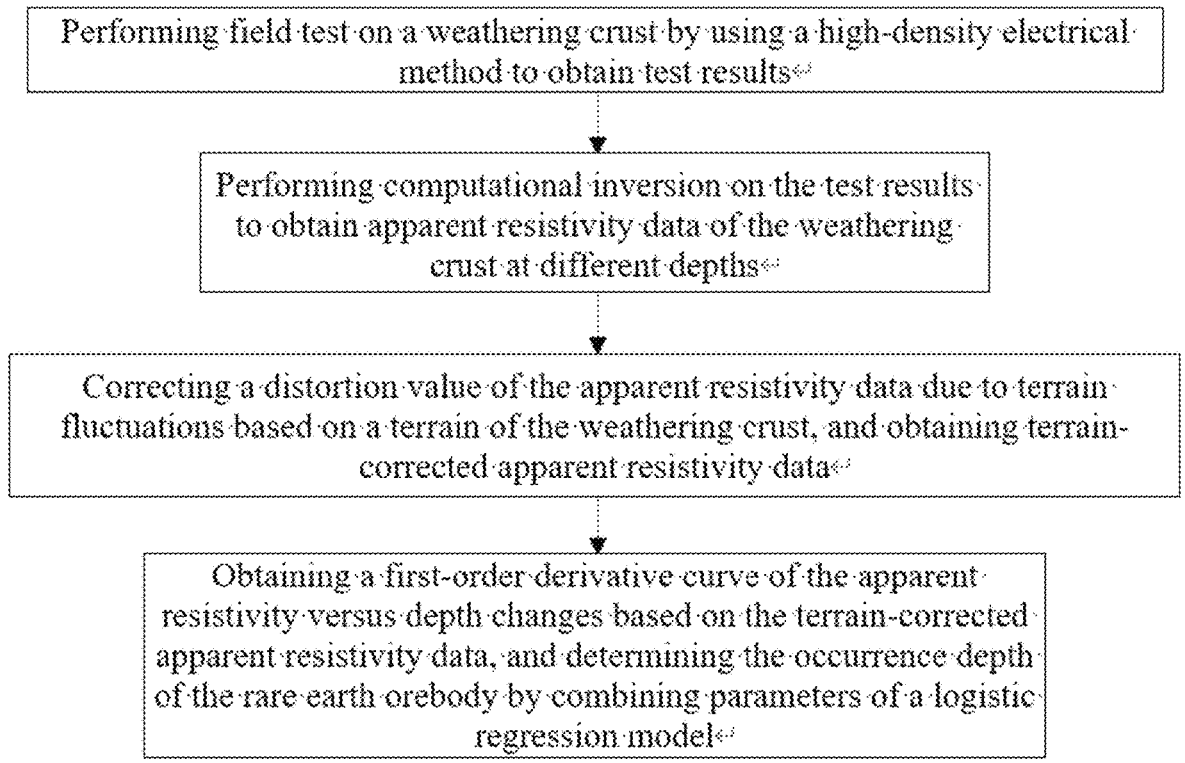
FIG. 1 is a schematic diagram of an overall flowchart according to an embodiment of the present invention.

An embodiment of the present invention discloses a method for predicting an occurrence depth of a weathering crust-type rare earth deposit orebody, as shown in FIG. 1, which includes the following steps:
    performing field test on a weathering crust by using a high-density electrical method to obtain test results;
    performing computational inversion on the test results to obtain apparent resistivity data of the weathering crust at different depths;
    correcting a distortion value of the apparent resistivity data due to terrain fluctuations based on a terrain of the weathering crust, and obtaining terrain-corrected apparent resistivity data; and
    obtaining a first-order derivative curve of the apparent resistivity versus depth changes based on the terrain-corrected apparent resistivity data, and determining the occurrence depth of the rare earth orebody by combining parameters of a logistic regression model.

In a specific embodiment, the field test includes: performing resistance sampling along a longitudinal direction of a survey line profile by taking the crest of the weathering crust as a midpoint and using a Winner device with set electrode spacing and channel number to obtain an observed apparent resistivity value of a survey point.

Figure 2:
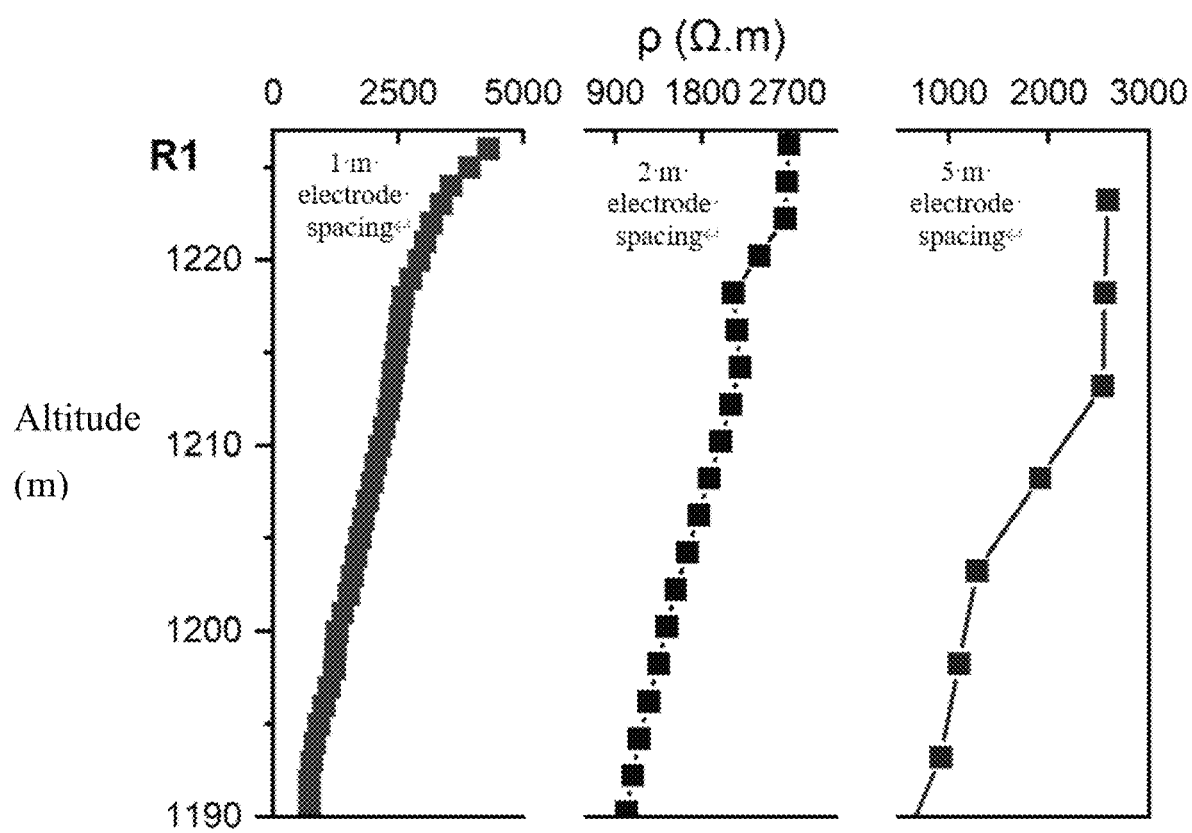
FIG. 2 is a schematic diagram showing the comparison of a terrain-corrected apparent resistivity of a weathering crust using 1 m, 2 m, and 5 m electrode spacings.
Figure 3A:
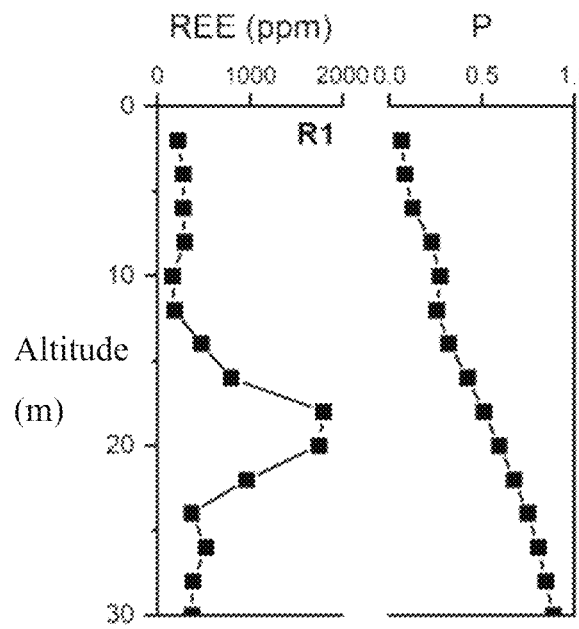
FIGS. 3A-3D are schematic diagrams showing the relationship between a rare earth element content and an orebody indicated by P value of 4 weathering crusts.
Figure 3B:
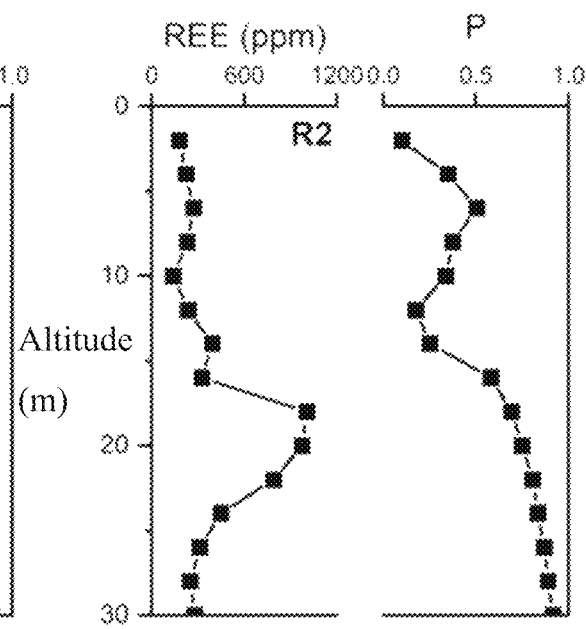
Figure 3C:
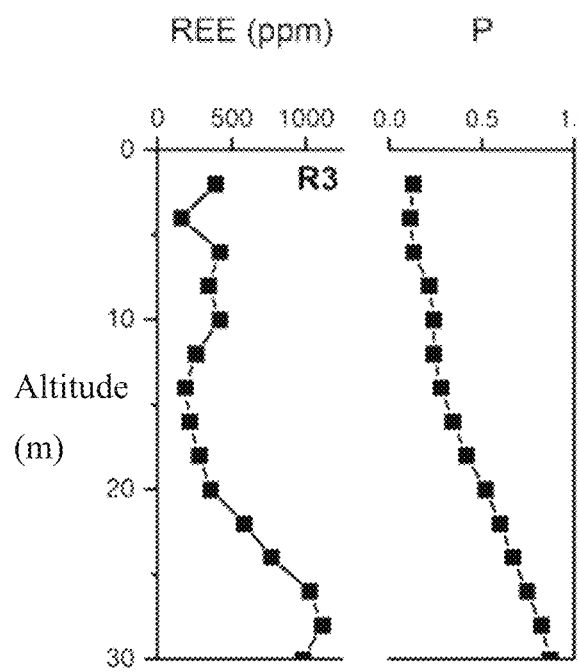
Figure 3D:
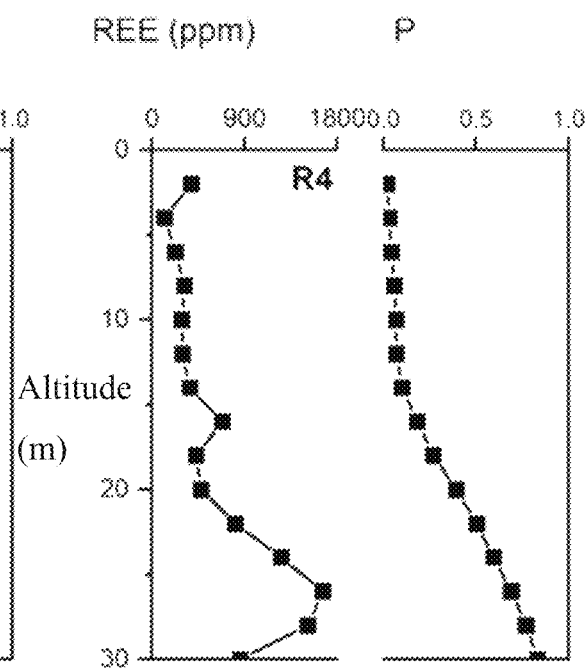

Specifically, the occurrence depth of the orebody of the weathering crust-type rare earth deposit is usually 1-30 m, and the thickness of the orebody is gradually reduced from the crest to the foot, so that the crest of the weathering crust is taken as a midpoint, survey lines extend to two sides of the ridge, and the survey points are arranged at different intervals along the survey lines. As shown in FIG. 2 and Table 1, after experiments, the test resolution using a 2 m electrode spacing by using the high-density electrical method, namely the test effect is close to that of a 1 m electrode spacing, and is much better than that of a 5 m electrode spacing; and meanwhile, the 2 m electrode spacing can effectively reduce the amount of calculation during data processing. Therefore, in this embodiment, a Winner device with a 2 m electrode spacing and 120 channels is used for field test.

TABLE 1

Relationship of depth-electrode spacing-resistivity

| 1 m electrode spacing | | 2 m electrode spacing | | 5 m electrode spacing | |
|---|---|---|---|---|---|
| Altitude (m) | Resistivity ($\Omega \cdot m$) | Altitude (m) | Resistivity ($\Omega \cdot m$) | Altitude (m) | Resistivity ($\Omega \cdot m$) |
| 1226.00 | 4297.97 | 1226.25 | 2708.02 | 1223.25 | 2585.01 |
| 1225.00 | 3924.74 | 1224.25 | 2689.80 | 1218.25 | 2562.935 |
| 1224.00 | 3551.50 | 1222.25 | 2671.57 | 1213.25 | 2540.86 |
| 1223.00 | 3351.82 | 1220.25 | 2399.86 | 1208.25 | 1910.645 |
| 1222.00 | 3152.14 | 1218.25 | 2128.14 | 1203.25 | 1280.43 |
| 1221.00 | 3027.32 | 1216.25 | 2163.62 | 1198.25 | 1100.546 |
| 1220.00 | 2902.49 | 1214.25 | 2199.10 | 1193.25 | 920.66 |
| 1219.00 | 2746.10 | 1212.25 | 2096.31 | | |
| 1218.00 | 2589.71 | 1210.25 | 1993.52 | | |
| 1217.00 | 2542.54 | 1208.25 | 1880.11 | | |
| 1216.00 | 2495.37 | 1206.25 | 1766.70 | | |
| 1215.00 | 2444.04 | 1204.25 | 1644.99 | | |
| 1214.00 | 2392.70 | 1202.25 | 1523.27 | | |
| 1213.00 | 2348.24 | 1200.25 | 1433.19 | | |
| 1212.00 | 2303.77 | 1198.25 | 1343.11 | | |
| 1211.00 | 2210.99 | 1196.25 | 1244.03 | | |
| 1210.00 | 2118.20 | 1194.25 | 1144.94 | | |
| 1209.00 | 2044.42 | 1192.25 | 1077.99 | | |
| 1208.00 | 1970.64 | 1190.25 | 1011.03 | | |
| 1207.00 | 1886.06 | | | | |
| 1206.00 | 1801.48 | | | | |
| 1205.00 | 1725.00 | | | | |
| 1204.00 | 1648.52 | | | | |
| 1203.00 | 1575.26 | | | | |
| 1202.00 | 1501.99 | | | | |
| 1201.00 | 1384.91 | | | | |
| 1200.00 | 1267.82 | | | | |
| 1199.00 | 1242.28 | | | | |
| 1198.00 | 1216.73 | | | | |
| 1197.00 | 1109.39 | | | | |
| 1196.00 | 1002.04 | | | | |
| 1195.00 | 911.58 | | | | |
| 1194.00 | 821.12 | | | | |
| 1193.00 | 772.81 | | | | |
| 1192.00 | 724.49 | | | | |
| 1191.00 | 724.49 | | | | |
| 1190.00 | 724.49 | | | | |

In a specific embodiment, the test result is subjected to computational inversion by a Zohdy method, the apparent resistivity of the weathering crust-type rare earth deposit is obtained by iterative computation, and an iterative formula is as follows:

$$\frac{\rho_{i+1}(l, n)}{\rho_i(l, n)} = \frac{\rho_0(l, n)}{\rho_{ci} * l, n)};$$

wherein (l,n) represents small cells in an $l^{th}$ row and an $n^{th}$ column, $\rho_i$ and $\rho_{i+1}$ represent resistivity values obtained in an $i^{th}$ iteration and an $(i+1)^{th}$ iteration, respectively, $\rho_0$ represents the observed apparent resistivity value, and $\rho_{ci}$ represents the apparent resistivity value obtained by finite element calculation.

Specifically, the initially obtained test result is used as an initial model and is divided into small units with set sizes corresponding to the survey points, and forward computation is performed on the initial model by using a finite element simulation method to obtain theoretical apparent resistivity values of the units; and the calculated theoretical apparent resistivity value is compared with the observed apparent resistivity value, the root mean square difference of all units is calculated, when the error is greater than the set range, the resistivity values of the small units are updated based on the iterative formula until the error is less than the set range and the iterative update is stopped, and the apparent resistivity data of the weathering crust is obtained based on the resistivity values of the small units obtained from the last iterative update.

Since the observed apparent resistivity values of the survey points in the field test are obtained by detecting the current through the electrode, the current of the small survey point unit not only includes the current that can pass through the small survey point unit but also includes part of current that passes through the adjacent small units, the observed apparent resistivity values directly calculated based on the currents and the voltages of the small survey point units are affected by the adjacent small units, and the actual resistance of the orebody at the survey point cannot be accurately represented. Therefore, the apparent resistivities of the survey points are further calculated by combining the Zohdy method with the finite element simulation method.

In a specific embodiment, the correcting a distortion value of the apparent resistivity data due to terrain fluctuations includes the following steps:

collecting elevations of survey points, and obtaining a terrain angular domain slope of the weathering crust based on the elevations of the survey points;

obtaining apparent resistivity distortion values of the survey points by using a product superposition formula;

wherein in a specific embodiment, the product superposition formula is as follows:

$$\frac{\rho_s}{\rho} \approx \left(\frac{\rho_s}{\rho}\right)_1 \cdot \left(\frac{\rho_s}{\rho}\right)_2 \frac{1}{\cos \beta_2} \cdot \left(\frac{\rho_s}{\rho}\right)_3 \frac{1}{\cos \beta_3} \cdots \left(\frac{\rho_s}{\rho}\right)_m \frac{1}{\cos \beta_m};$$

wherein $\rho_s/\rho$ is an apparent resistivity distortion value at a point on the continuous finite terrain, $(\rho_s/\rho)_1 \ldots (\rho_s/\rho)_m$ are apparent resistivity distortion values of the corresponding points in each angular domain, and $\beta_1 \ldots \beta_m$ are slopes of the angular domains at the corresponding point; and comparing the apparent resistivity $\rho_{ci}$ with the apparent resistivity distortion value $\rho_s/\rho$ by using a ratio method to obtain the terrain-corrected apparent resistivity data $\rho_d$.

Specifically, the distribution of the underground electric field is changed due to terrain fluctuations of the weathering crust, the apparent resistivity is distorted, and thus useful geological information is concealed. Through the coordinates and elevations of the survey points, a broken line representing the terrain fluctuations can be obtained, and the angular domain that causes distortion to the apparent resistivity can be determined based on the broken line. The apparent resistivity value obtained under the original terrain conditions is divided by the apparent resistivity value obtained after mapping the survey line to the same plane to obtain the apparent resistivity distortion value $\rho_s/\rho$, the terrain anomaly value of a certain survey point on the continuous terrain can be calculated by the terrain anomaly values of adjacent m angular domain survey points through the superposition formula, and then the apparent resistivity $\rho_{ci}$ is compared with the apparent resistivity distortion value $\rho_s/\rho$ using the ratio method, that is, the apparent resistivity is divided by the apparent resistivity distortion value to obtain the terrain-corrected apparent resistivity value $\rho_d$ of each survey point.

In a specific embodiment, the method for predicting the occurrence depth of the weathering crust-type rare earth deposit orebody includes:

averaging apparent resistivities of adjacent points in the longitudinal direction of the survey line profile in the terrain-corrected apparent resistivity data, and further fitting to obtain a longitudinal apparent resistivity curve; and deriving the longitudinal apparent resistivity curve to obtain a first-order derivative of the survey line profile, namely a first-order derivative curve of the apparent resistivity versus depth changes, and obtaining the occurrence depth of the orebody by using a logistic regression algorithm.

The specific method includes as follows: the depth, apparent resistivity and first-order derivative are selected as feature variables, and whether the orebody is judged or not is selected as a label variable, wherein 1 represents the orebody, and 0 represents non-orebody.

The logistic regression model is constructed using feature variables and label variables, and the model is trained to find the optimal parameters using the maximum likelihood estimation method. After training is completed, the coefficient and intercept of the logistic regression model are obtained. The model parameter obtained through training is as follows:

$$y=0.10984649 \times \text{Depth} - 0.00107128 \times \rho_a - 0.00172985 \times \text{FirstDerivative} + 0.00158755$$

The y logistic regression output value is as follows:

$$P = \frac{1}{1+e^{-y}}$$

wherein y represents the intercept, P represents the logistic regression output coefficient, Depth represents the depth, FirstDerivative represents the first-order derivative; and the occurrence depth of the orebody is judged, and the position of the orebody is judged when P is more than 0.5.

Figure 4A:
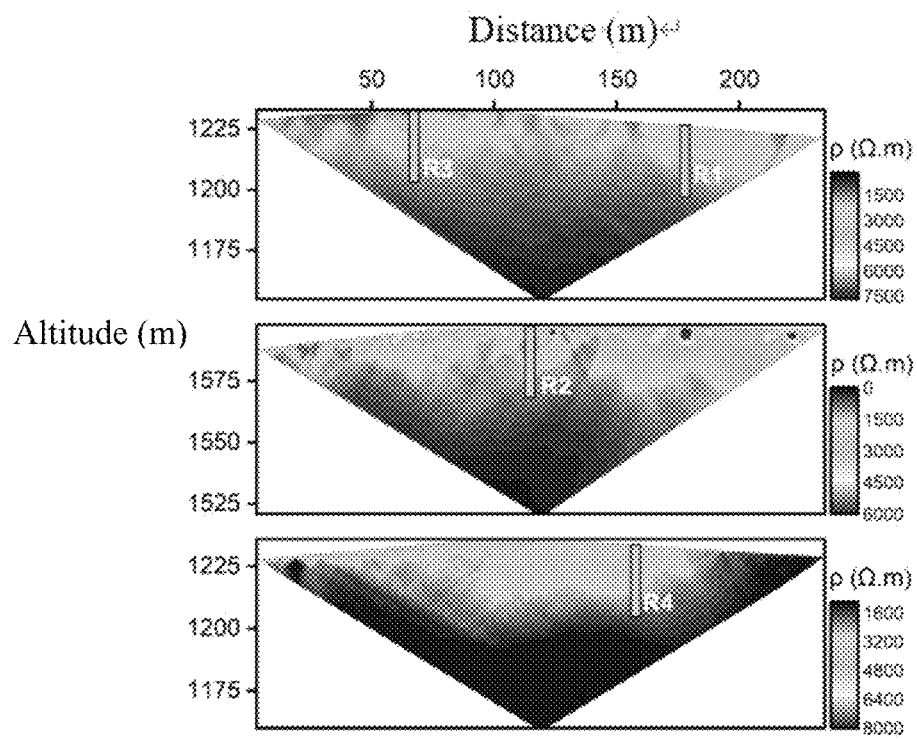
FIGS. 4A-4B are diagrams showing the distribution of a terrain-corrected apparent resistivity of a cross-sectional profile corresponding to a weathering crust and orebody probability (P value).
Figure 4B:
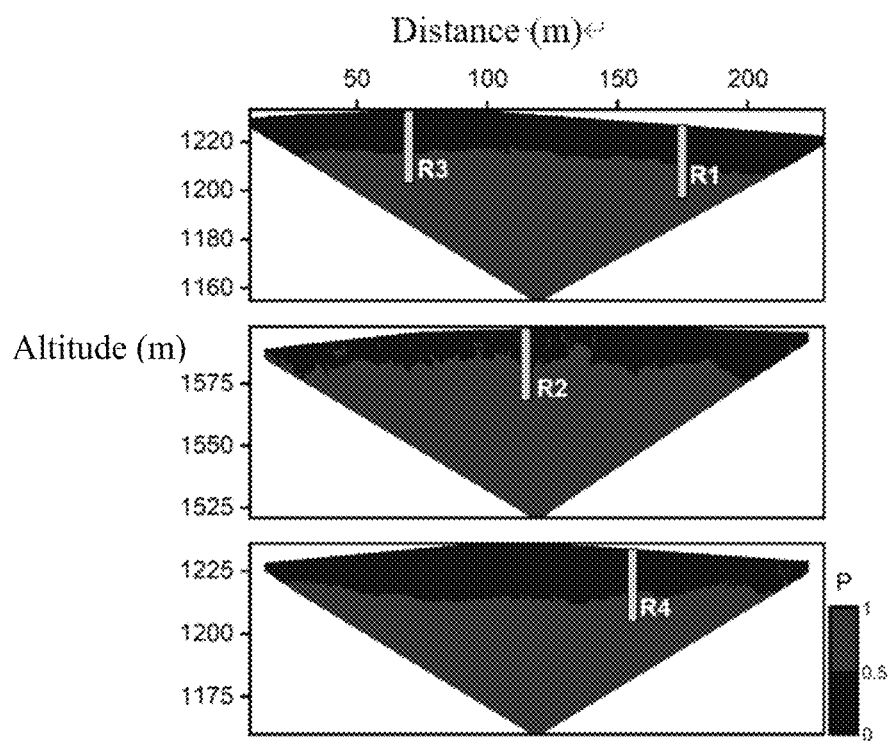

In a specific embodiment, the weathering crust samples (R1, R2, R3, R4) of 4 weathering crust-type rare earth deposits are tested in the field using a high-density electrical method with a Winner device with a 2 m electrode spacing and 120 channels, the obtained measured apparent resistivities are subjected to computational inversion using the Zohdy method, the inversion results are subjected to terrain correction to obtain terrain-corrected apparent resistivities, the apparent resistivities after terrain correction and inversion of every two adjacent points are averaged once in the longitudinal direction, the first-order derivative of the apparent resistivities after terrain correction and inversion is calculated in the Origin software (as shown in Table 2), and the P value is obtained based on the parameters of the logistic regression model. P>0.5 indicates the position of the orebody in the weathering crust (as shown in FIGS. 3A-3D). The apparent resistivities after terrain correction and inversion of every two adjacent points are averaged in the longitudinal direction of the survey line profile, then the derivation is performed in the Origin software, and the P value is calculated. A distribution diagram of the P values of the survey lines is drawn in the Origin software. The values greater than 0.5 are rendered to obtain the occurrence depth of the orebody in the section (as shown in FIGS. 4A-4B).

TABLE 2

Relationship of weathering crust depth-content of rare earth elements-resistivity-first-order derivative-P value

| Weathering crust | Altitude (m) | Depth (m) | Content of rare earth elements (ppm) | Resistivity ($\Omega \cdot m$) | First-order derivative | y | P |
|---|---|---|---|---|---|---|---|
| R1 | 1226.25 | 2 | 219 | 2708.02 | −18.23 | −2.65 | 0.07 |
|    | 1224.25 | 4 | 280 | 2689.80 | −18.23 | −2.41 | 0.08 |
|    | 1222.25 | 6 | 273 | 2671.57 | −144.97 | −1.95 | 0.12 |
|    | 1220.25 | 8 | 293 | 2399.86 | −271.72 | −1.22 | 0.23 |
|    | 1218.25 | 10 | 163 | 2128.14 | −118.12 | −0.98 | 0.27 |
|    | 1216.25 | 12 | 184 | 2163.62 | 35.48 | −1.06 | 0.26 |
|    | 1214.25 | 14 | 473 | 2199.10 | −33.66 | −0.76 | 0.32 |
|    | 1212.25 | 16 | 791 | 2096.31 | −102.79 | −0.31 | 0.42 |
|    | 1210.25 | 18 | 1794 | 1993.52 | −108.10 | 0.03 | 0.51 |
|    | 1208.25 | 20 | 1746 | 1880.11 | −113.41 | 0.38 | 0.59 |
|    | 1206.25 | 22 | 961 | 1766.70 | −117.56 | 0.73 | 0.67 |
|    | 1204.25 | 24 | 365 | 1644.99 | −121.72 | 1.09 | 0.75 |
|    | 1202.25 | 26 | 524 | 1523.27 | −105.90 | 1.41 | 0.80 |
|    | 1200.25 | 28 | 380 | 1433.19 | −90.08 | 1.70 | 0.85 |
|    | 1198.25 | 30 | 374 | 1343.11 | −94.58 | 2.02 | 0.88 |
| R2 | 1597.00 | 2 | 179 | 4293.65 | −1264.56 | −2.19 | 0.10 |
|    | 1595.00 | 4 | 222 | 3029.10 | −1264.56 | −0.62 | 0.35 |
|    | 1593.00 | 6 | 271 | 1764.54 | −721.49 | 0.02 | 0.50 |
|    | 1591.00 | 8 | 232 | 1586.11 | −178.43 | −0.51 | 0.38 |
|    | 1589.00 | 10 | 139 | 1407.68 | 153.30 | −0.67 | 0.34 |
|    | 1587.00 | 12 | 234 | 1892.71 | 485.03 | −1.55 | 0.18 |
|    | 1585.00 | 14 | 391 | 2377.73 | 43.09 | −1.08 | 0.25 |
|    | 1583.00 | 16 | 322 | 1978.88 | −398.86 | 0.33 | 0.58 |
|    | 1581.00 | 18 | 1003 | 1580.02 | −304.56 | 0.81 | 0.69 |
|    | 1579.00 | 20 | 975 | 1369.75 | −210.27 | 1.09 | 0.75 |
|    | 1577.00 | 22 | 788 | 1159.48 | −145.80 | 1.43 | 0.81 |
|    | 1575.00 | 24 | 446 | 1078.16 | −81.32 | 1.62 | 0.84 |
|    | 1573.00 | 26 | 310 | 996.84 | −55.04 | 1.88 | 0.87 |
|    | 1571.00 | 28 | 249 | 968.07 | −28.77 | 2.09 | 0.89 |
|    | 1569.00 | 30 | 276 | 939.30 | −68.21 | 2.41 | 0.92 |

TABLE 2-continued

Relationship of weathering crust depth-content of rare earth elements-resistivity-first-order derivative-P value

| Weathering crust | Altitude (m) | Depth (m) | Content of rare earth elements (ppm) | Resistivity (Ω · m) | First-order derivative | y | P |
|---|---|---|---|---|---|---|---|
| R3 | 1232.71 | 2 | 392 | 1463.88 | 336.22 | −1.93 | 0.13 |
| | 1230.71 | 4 | 161 | 1800.10 | 336.22 | −2.07 | 0.11 |
| | 1228.71 | 6 | 421 | 2136.31 | 148.28 | −1.88 | 0.13 |
| | 1226.71 | 8 | 343 | 2096.66 | −39.66 | −1.30 | 0.21 |
| | 1224.71 | 10 | 422 | 2057.00 | 28.36 | −1.15 | 0.24 |
| | 1222.71 | 12 | 259 | 2153.37 | 96.37 | −1.15 | 0.24 |
| | 1220.71 | 14 | 189 | 2249.74 | 47.63 | −0.95 | 0.28 |
| | 1218.71 | 16 | 217 | 2248.64 | −1.11 | −0.65 | 0.34 |
| | 1216.71 | 18 | 281 | 2247.53 | −51.72 | −0.34 | 0.42 |
| | 1214.71 | 20 | 357 | 2145.20 | −102.33 | 0.08 | 0.52 |
| | 1212.71 | 22 | 584 | 2042.87 | −94.05 | 0.39 | 0.60 |
| | 1210.71 | 24 | 768 | 1957.11 | −85.76 | 0.69 | 0.67 |
| | 1208.71 | 26 | 1028 | 1871.35 | −121.53 | 1.06 | 0.74 |
| | 1206.71 | 28 | 1112 | 1714.05 | −157.31 | 1.51 | 0.82 |
| | 1204.71 | 30 | 981 | 1556.74 | −143.25 | 1.88 | 0.87 |
| R4 | 1233.75 | 2 | 380 | 3893.65 | −104.73 | −3.77 | 0.02 |
| | 1231.75 | 4 | 121 | 3788.92 | −104.73 | −3.44 | 0.03 |
| | 1229.75 | 6 | 227 | 3684.19 | −107.24 | −3.10 | 0.04 |
| | 1227.75 | 8 | 318 | 3574.44 | −109.75 | −2.76 | 0.06 |
| | 1225.75 | 10 | 295 | 3464.69 | −22.42 | −2.57 | 0.07 |
| | 1223.75 | 12 | 296 | 3529.61 | 64.92 | −2.57 | 0.07 |
| | 1221.75 | 14 | 369 | 3594.52 | −74.76 | −2.18 | 0.10 |
| | 1219.75 | 16 | 686 | 3380.09 | −214.44 | −1.49 | 0.18 |
| | 1217.75 | 18 | 432 | 3165.65 | −243.81 | −0.99 | 0.27 |
| | 1215.75 | 20 | 482 | 2892.46 | −273.19 | −0.43 | 0.39 |
| | 1213.75 | 22 | 813 | 2619.27 | −235.19 | 0.02 | 0.50 |
| | 1211.75 | 24 | 1258 | 2422.09 | −197.18 | 0.38 | 0.59 |
| | 1209.75 | 26 | 1663 | 2224.91 | −191.32 | 0.81 | 0.69 |
| | 1207.75 | 28 | 1519 | 2039.46 | −185.45 | 1.21 | 0.77 |
| | 1205.75 | 30 | 859 | 1854.01 | −173.12 | 1.61 | 0.83 |

An embodiment of the present invention further discloses a system for predicting an occurrence depth of a weathering crust-type rare earth deposit orebody, which includes:
 a data acquisition module, configured to perform field test on a weathering crust by using a high-density electrical method to obtain test results;
 an inversion module, configured to perform computational inversion on the test results to obtain apparent resistivity data of the weathering crust;
 a distortion correction module, configured to correct a distortion value of the apparent resistivity data due to terrain fluctuations based on a terrain of the weathering crust, and obtain terrain-corrected apparent resistivity data by using a ratio method; and
 an occurrence depth confirmation module, configured to obtain a first-order derivative curve of the apparent resistivity versus depth changes based on the terrain-corrected apparent resistivity data, and determine the occurrence depth of the rare earth orebody by combining parameters of a logistic regression model.

The embodiments in the specification are all described in a progressive manner, and each embodiment focuses on differences from other embodiments, and portions that are the same and similar between the embodiments may be referred to each other. Since the apparatus disclosed in the embodiment corresponds to the method disclosed in the embodiment, the description is relatively simple, and reference may be made to the partial description of the method.

The above description of the disclosed embodiments enables those skilled in the art to implement or use the present invention. Various modifications to these embodiments will be readily apparent to those skilled in the art, and the generic principles defined herein may be applied to other embodiments without departing from the spirit or scope of the present invention. Thus, the present invention is not intended to be limited to these embodiments shown herein but is to be accorded the broadest scope consistent with the principles and novel features disclosed herein.

What is claimed is:
1. A method for predicting an occurrence depth of a weathering crust-type rare earth deposit orebody, comprising the following steps:
 performing, by a data acquisition module, a field test on a weathering crust by using a high-density electrical method to obtain test results, wherein the field test includes performing resistance sampling along a longitudinal direction of a survey line profile by taking the crest of the weathering crust as a midpoint and using a Winner device with set electrode spacing and channel number to obtain an observed apparent resistivity value of a survey point, and wherein the observed apparent resistivity value is obtained through an electrode;
 performing a computational inversion on the test results to obtain apparent resistivity data of the weathering crust at different depths;
 correcting a distortion value of the apparent resistivity data due to terrain fluctuations based on a terrain of the weathering crust, and obtaining terrain-corrected apparent resistivity data; and
 obtaining a first-order derivative curve of apparent resistivity versus depth changes based on the terrain-corrected apparent resistivity data, and determining the occurrence depth of the weathering crust-type rare earth deposit orebody by combining parameters of a logistic regression model.

2. The method for predicting the occurrence depth of the weathering crust-type rare earth deposit orebody according to claim 1, wherein the test result is subjected to the computational inversion by a Zohdy method, an apparent resistivity of the weathering crust-type rare earth deposit orebody is obtained by an iterative computation, and an iterative formula is as follows:

$$\frac{\rho_{i+1}(l, n)}{\rho_i(l, n)} = \frac{\rho_0(l, n)}{\rho_{ci} * l, n)};$$

wherein (l,n) represents small cells in an $l^{th}$ row and an $n^{th}$ column, $\rho_i$ and $\rho_{i+1}$ represent resistivity values obtained in an $i^{th}$ iteration and an $(i+1)^{th}$ iteration, respectively, $\rho_0$ represents the observed apparent resistivity value, and $\rho_{ci}$ represents an apparent resistivity value obtained by a finite element calculation.

3. The method for predicting the occurrence depth of the weathering crust-type rare earth deposit orebody according to claim 1, wherein the step of correcting the distortion value of the apparent resistivity data due to the terrain fluctuations comprises the following steps:
collecting elevations of survey points, and obtaining a terrain angular domain slope of the weathering crust based on the elevations of the survey points;
obtaining apparent resistivity distortion values of the survey points by using a product superposition formula;

$$\frac{\rho_s}{\rho} \approx \left(\frac{\rho_s}{\rho}\right)_1 \cdot \left(\frac{\rho_s}{\rho}\right)_2 \frac{1}{\cos\beta_2} \cdot \left(\frac{\rho_s}{\rho}\right)_3 \frac{1}{\cos\beta_3} \cdots \left(\frac{\rho_s}{\rho}\right)_m \frac{1}{\cos\beta_m};$$

wherein $\rho_s/\rho$ is an apparent resistivity distortion value at a point on a continuous finite terrain, $(\rho_s/\rho)_1 \ldots (\rho_s/\rho)_m$ are apparent resistivity distortion values of corresponding points in each of angular domains, and $\beta_1 \ldots \beta_m$ are slopes of the angular domains at the corresponding point; and
comparing the apparent resistivity value $\rho_{ci}$ with the apparent resistivity distortion value $\rho_s/\rho$ by using a ratio method to obtain the terrain-corrected apparent resistivity data $\rho_d$.

4. The method for predicting the occurrence depth of the weathering crust-type rare earth deposit orebody according to claim 1, wherein apparent resistivities of adjacent points in a longitudinal direction of a survey line profile in the terrain-corrected apparent resistivity data are averaged and fitted to obtain an encrypted longitudinal apparent resistivity curve; the encrypted longitudinal apparent resistivity curve is derived to obtain the first-order derivative curve of the apparent resistivity versus depth changes;
a formula of the logistic regression model is as follows:

$y=0.10984649\times\text{Depth}-0.00107128\times\rho_d-0.00172985\times\text{FirstDerivative}+0.00158755$ $$P = \frac{1}{1+e^{-y}}$$

wherein y represents an intercept, P represents a logistic regression output coefficient, Depth represents a depth, FirstDerivative represents a first-order derivative; and judging a position of a orebody by using the parameters of the logistic regression model by combining the depth and a corrected apparent resistivity value, and judging the orebody when P is more than 0.5.

5. A system for predicting an occurrence depth of a weathering crust-type rare earth deposit orebody, comprising:
a data acquisition module, configured to perform a field test on a weathering crust by using a high-density electrical method to obtain test results, wherein the field test includes performing resistance sampling along a longitudinal direction of a survey line profile by taking the crest of the weathering crust as a midpoint and using a Winner device with set electrode spacing and channel number to obtain an observed apparent resistivity value of a survey point, and wherein the observed apparent resistivity value is obtained through an electrode;
an inversion module, configured to perform a computational inversion on the test results to obtain apparent resistivity data of the weathering crust at different depths;
a distortion correction module, configured to correct a distortion value of the apparent resistivity data due to terrain fluctuations based on a terrain of the weathering crust, and obtain terrain-corrected apparent resistivity data by using a ratio method; and
an occurrence depth confirmation module, configured to obtain a first-order derivative curve of apparent resistivity versus depth changes based on the terrain-corrected apparent resistivity data, and determine the occurrence depth of the weathering crust-type rare earth deposit orebody by combining parameters of a logistic regression model.

\* \* \* \* \*